United States Patent
Maeda

(10) Patent No.: US 11,923,261 B2
(45) Date of Patent: Mar. 5, 2024

(54) SEMICONDUCTOR DEVICE

(71) Applicant: SANSHA ELECTRIC MANUFACTURING CO., LTD., Osaka (JP)

(72) Inventor: Koutarou Maeda, Osaka (JP)

(73) Assignee: Sansha Electric Manufacturing Co., Ltd., Osaka (JP)

( * ) Notice: Subject to any disclaimer, the term of this patent is extended or adjusted under 35 U.S.C. 154(b) by 108 days.

(21) Appl. No.: 17/487,674

(22) Filed: Sep. 28, 2021

(65) Prior Publication Data
US 2022/0115286 A1    Apr. 14, 2022

(30) Foreign Application Priority Data
Oct. 9, 2020  (JP) ................. 2020-170934

(51) Int. Cl.
| | | |
|---|---|---|
| *H01L 23/28* | (2006.01) | |
| *H01L 21/56* | (2006.01) | |
| *H01L 23/053* | (2006.01) | |
| *H01L 23/31* | (2006.01) | |

(52) U.S. Cl.
CPC ........ *H01L 23/3107* (2013.01); *H01L 21/565* (2013.01); *H01L 23/053* (2013.01)

(58) Field of Classification Search
CPC .......... H01L 21/565; H01L 2224/0603; H01L 2224/32225; H01L 2924/181; H01L 23/3121; H01L 23/3735; H01L 23/4334; H01L 23/49562
USPC ........................................ 257/787
See application file for complete search history.

(56) References Cited

U.S. PATENT DOCUMENTS

| | | | | |
|---|---|---|---|---|
| 2014/0374889 A1* | 12/2014 | Denta | ..................... | H01L 24/49 257/666 |
| 2015/0084173 A1* | 3/2015 | Zhang | ................. | H01L 23/4334 257/676 |

FOREIGN PATENT DOCUMENTS

JP    2017092389 A1    5/2017

* cited by examiner

*Primary Examiner* — Jami Valentine Miller
*Assistant Examiner* — Dilinh P Nguyen
(74) *Attorney, Agent, or Firm* — Duane Morris LLP

(57) ABSTRACT

A semiconductor chip is provided on a semiconductor circuit base on one surface of an insulating substrate. A reinforcement and balance base is provided on the one surface of the insulating substrate spaced to the semiconductor circuit base. The insulating substrate 4, the semiconductor circuit base, the semiconductor chip, and the reinforcement and balance base are sealed into a resin-molded sealing body. The sealing body has resin non-adhering portions.

4 Claims, 4 Drawing Sheets

SEMICONDUCTOR DEVICE

TECHNICAL FIELD

This invention relates to a semiconductor device and, more particularly, to it having a resin molded enclosure.

BACKGROUND ART

An example of the above-stated type of a semiconductor device is disclosed in Japanese published unexamined patent application No. 2017-92389A. In this semiconductor device, a lead frame has a die pad including lead terminals. A semiconductor element is mounted on the die pad. The lead frame is sealed with a resin enclosure so that the die pad and the semiconductor element are located into the enclosure. The enclosure is made by arranging the lead frame in a resin molding die with the lead terminals protruding from the resin molding die, and injecting resin into the die. In the sealed semiconductor device, parts of the die pad are exposed from the enclosure, as shown in FIG. 9 of Japanese published unexamined patent application No. 2017-92389A.

The cause of the exposure of parts of the die pad is supposed that the frame is pushed into the molding die by the protrusions formed on the molding die. When the resin is injected into the molding die, the resin does not adhere to the places where the protrusions are present in the molding die so that the parts in the die pad pushed by the protrusion are exposed from the enclosure. When an operator energizes the semiconductor device, a current flows through the exposed parts in the die pad, and when the operator touches the exposed parts with his/her hand, the operator can get an electric shock. In order to prevent electric shock, it is necessary to maintain the insulation of the semiconductor device. Therefore after removing the semiconductor device from the molding die, resin can be applied to the exposed portions of the die pad to cover them. As a result, resin-related work (injection and coating) needs to be performed a plurality of times.

An object of the present invention is to provide a semiconductor device capable of maintaining insulation even once for resin-related work.

SUMMARY OF INVENTION

In one aspect of the semiconductor device in accordance with the present invention, a semiconductor circuit base is provided on one surface of an insulating substrate. A semiconductor chip is provided on the semiconductor circuit base. The semiconductor circuit base can be configured so that current flows from the semiconductor chip to the semiconductor circuit base. A reinforcement and balance base is spaced to the semiconductor circuit base on the one surface of the insulating substrate. The reinforcement and balance base can be used, for example, to fixes the semiconductor device to a heat sink by using a fixing tool, for example bolt. The insulating substrate, the semiconductor circuit base, and the reinforcement and balance base can be manufactured, for example, by processing a base material having an insulating substrate and a metal film on the entire area of the one surface of the insulating substrate. By removing a part of the metal film of the base material, for example, by etching, the insulating substrate having the semiconductor circuit base and the reinforcement and balance base, spaced to each other on the one surface thereof is produced. The base material can be a DCB (Direct Copper Bonding) substrate. The insulating substrate, the semiconductor circuit base, the semiconductor chip, and the reinforcement and balance base are sealed into a resin-molded enclosure. The enclosure has a resin non-adhering portion. The resin molded enclosure can be, for example, a transfer molded enclosure. The resin non-adhesive portion can be formed, for example, by arranging a holding tool in a transfer molding die. In this case the holding tool can be contacted with the insulating substrate in order to hold the insulating substrate in the die, when the insulating substrate with the semiconductor base having the semiconductor chip is placed in the die Since the semiconductor circuit base and the reinforcement and balance base in the semiconductor device are arranged spaced to each other in the enclosure, the semiconductor circuit base and the reinforcement and balance base are insulated from each other. Therefore, it is not necessary to fill the resin non-adhesive portion in the enclosure with the resin.

In the above aspect of the semiconductor device, the resin non-adhesive portion can be formed at a position corresponding to the reinforcement and balance base. If the semiconductor circuit base and the reinforcement and balance base are provided without being insulated and the resin non-adhesive portion is provided at the position corresponding to the reinforcement and balance base, it is necessary to newly fill the resin non-adhering portion with resin in order to prevent an electric shock from the operator. On the other hand, in this configuration, since the reinforcement and balance base and the semiconductor circuit base are insulated, there is no risk of electric shock even if the resin non-adhesive portion exists at a position corresponding to the reinforcement and balance base in the enclosure.

Further, the reinforcement and balance base can be provided on the insulating substrate with being opposite to the protruding direction of leads connected to the semiconductor chip. In this case, the resin non-adhering portion is provided at a position where the holding tool contacts in the insulating substrate when the enclosure is made by the resin mold. Since the leads are provided on the semiconductor circuit base, they protrude from one end of the enclosure. In the case, it is desirable to bring the holding tool into contact with the reinforcement and balance base which exists in the opposite side of the leads, from the viewpoint of preventing the insulating substrate from moving or warping during resin injection. Therefore, the resin non-adhesive portion is provided at a position corresponding to the reinforcement and balance base. If the reinforcement and balance base and the semiconductor circuit base are provided integrally, it is necessary to inject the resin into the resin non-adhering portion in order to maintain the insulation of the reinforcement and balance base and the semiconductor base. In this configuration, since the semiconductor circuit base and the reinforcement and balance base are insulated, it is not necessary to inject the resin into the resin non-adhesive portion even if the resin non-adhesive portion is provided.

DESCRIPTION OF EMBODIMENTS

Figure 1:
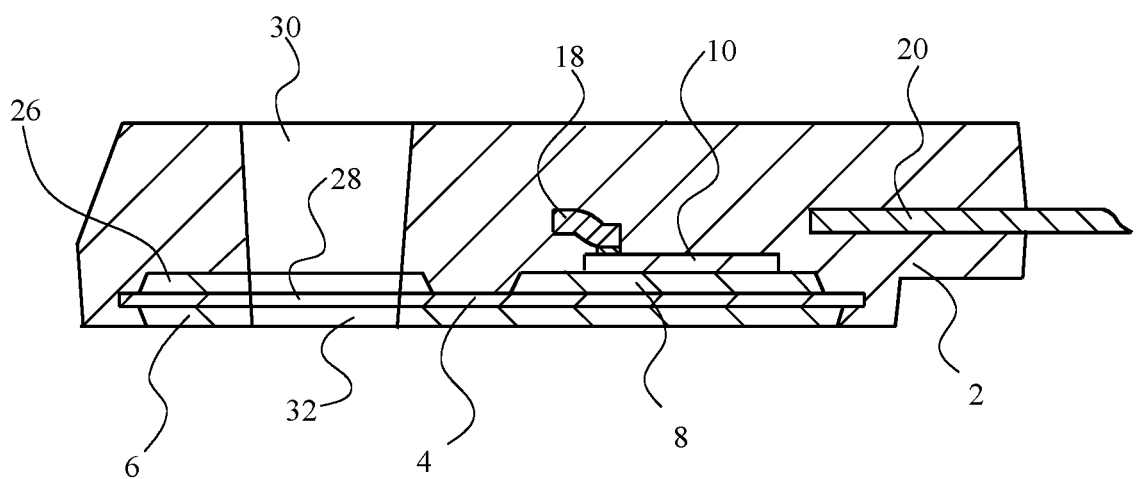
FIG. 1 is a central vertical cross-sectional side view of the semiconductor device according to an embodiment of the present invention.
Figure 2:
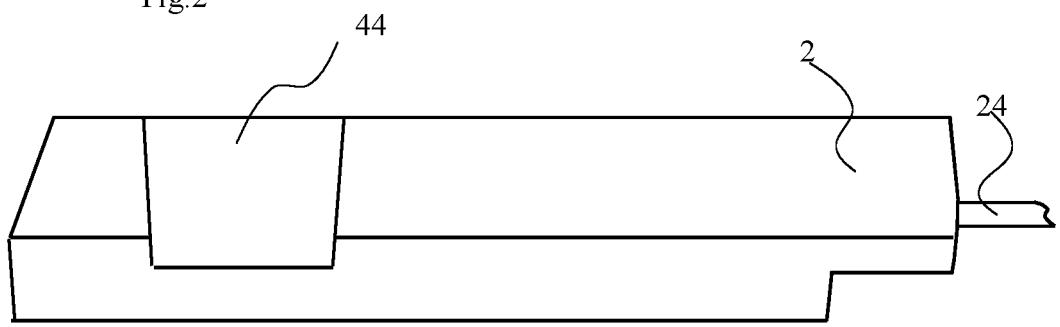
FIG. 2 is a side view of the semiconductor device of FIG. 1
Figure 3:
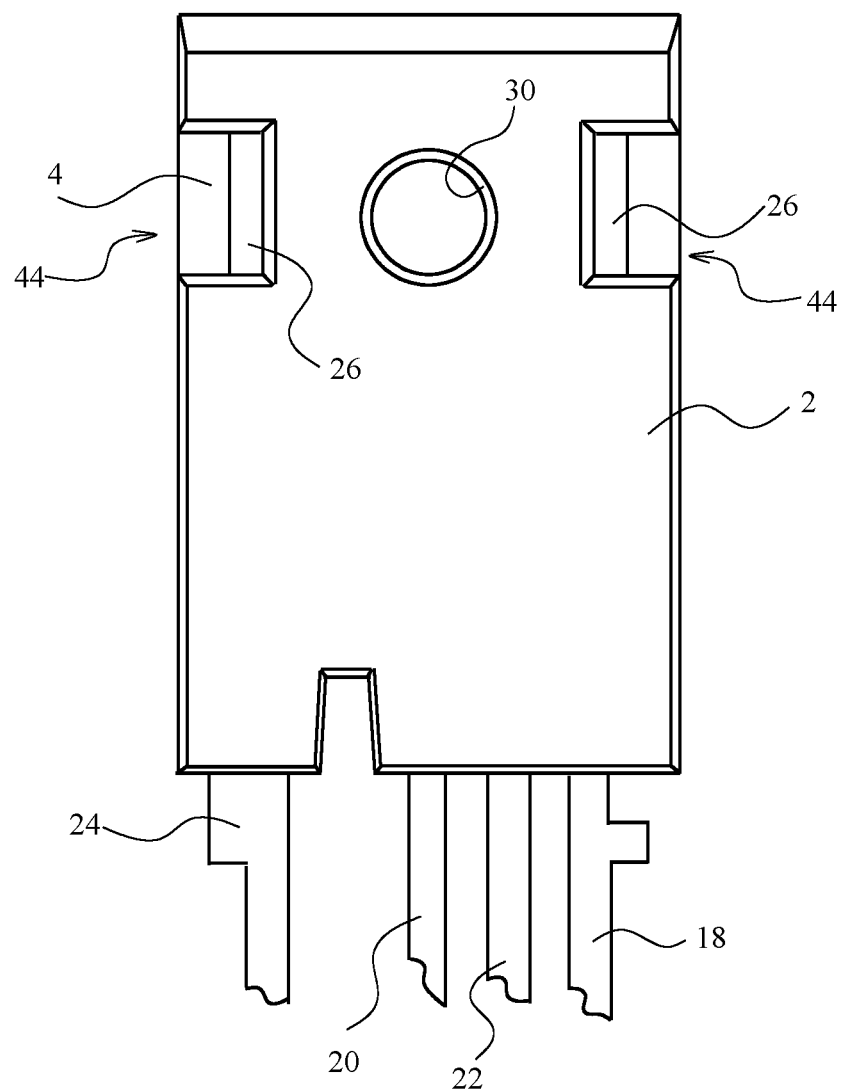
FIG. 3 is a front view of the semiconductor device of FIG. 1.

A semiconductor device of one embodiment in accordance with the present invention is a discrete semiconductor device, for example, a MOSFET. As shown in FIGS. 1 to 3, the MOSFET has a resin-made enclosure, for example, a resin-made sealing body 2 which is a substantially flat rectangular parallelepiped shape.

As shown in FIG. 1, an insulating substrate 4 having a rectangular shape, for example, is placed into the sealing body 2. A heat dissipation base, for example a heat dissipation film 6 made of metal, for example copper, is provided on the entire surface of one surface of the insulating substrate 4. The heat dissipation film 6 is exposed on one surface of the sealing body 2. The heat dissipation film 6 is contact with the heat sink when the semiconductor devise is fixed to the heat sink.

Figure 4:
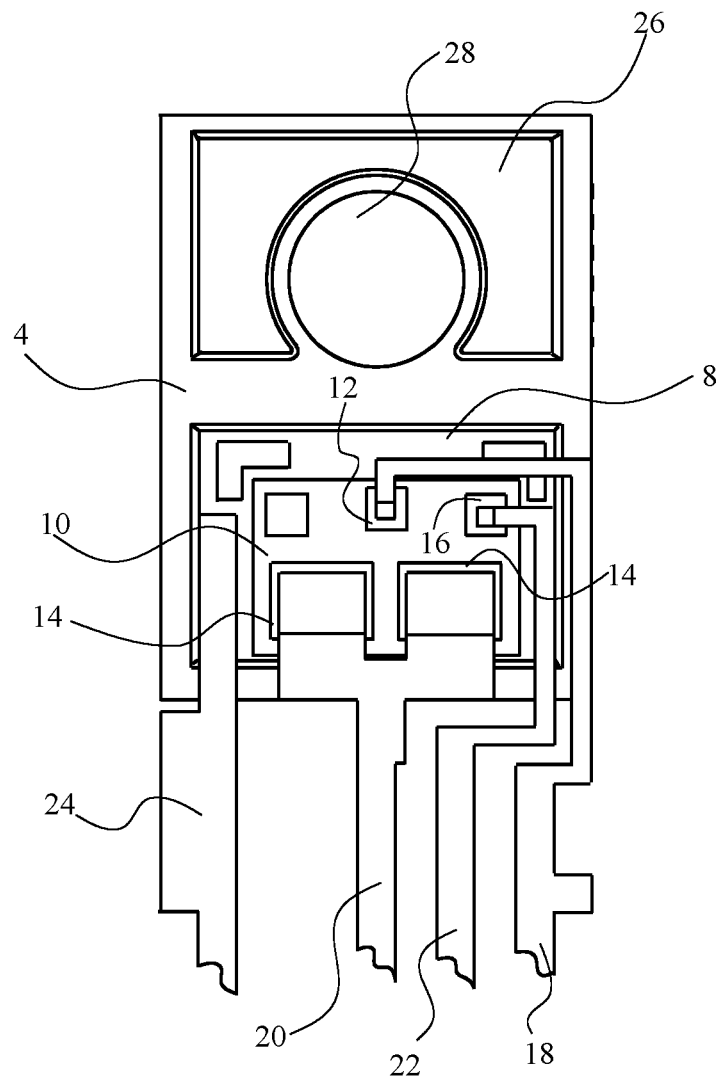
FIG. 4 is a front view of the internal structure of the semiconductor device of FIG. 1.

As shown in FIGS. 1 and 4, a semiconductor circuit base, for example, semiconductor circuit film 8 is provided on a surface of the insulating substrate 4 opposite to the heat dissipation film 6. The semiconductor circuit film 8 having a substantially rectangular shape, for example, is also made of metal, for example, copper, and is located in an area from one end side of the insulating substrate 4 to a vicinity slightly beyond the center of the insulating substrate 4. A MOSFET semiconductor chip 10 is mounted on the semiconductor circuit film 8. The semiconductor chip 10 has two facing surfaces. A drain region is formed on one surface of the semiconductor chip 10, and the drain region is electrically connected to the semiconductor circuit film 8. A gate pad 12, source pads 14 and 14, and a source sense pad 16 are formed on the other surface of the semiconductor chip 10. A gate lead 18 is connected to the gate pad 12. A source lead 20 having a bifurcated tip is connected to the source pads 14 and 14. A source sense lead 22 is connected to the source sense pad 16. A drain lead 24 is connected to the semiconductor circuit film 8 to which the drain region is connected.

A reinforcement and balance base , for example reinforcement and balance film 26 made of metal, for example, copper is provided in a region from the other end side of the insulating substrate 4 to a little before the center thereof. The reinforcement and balance film 26 and the semiconductor circuit film 8 are located apart from each other and are insulated from each other. The reinforcement and balance film 26 has a rectangular shape with a removed portion. An insertion hole 28 is formed in the removed portion. A bolt for fixing the semiconductor device to the heat sink is inserted into the insertion hole 28. As shown in FIG. 1, an insertion hole 30 corresponding to the insertion hole 28 is also formed in the resin sealing body 2, and an insertion hole 32 corresponding to the insertion hole 28 is also formed in the heat dissipation film 6.

The insulating substrate 4, the heat dissipation film 6, the semiconductor circuit film 8, and the reinforcement and balance film 26 are made by removing , for example, etching a material base, for example, a DCB (Direct Copper Bonding) substrate in which copper is directly sintered or brazed on both sides of an insulating substrate.

Resin non-adhesive portions 44 and 44 are provided on both sides of the insertion hole 30 as described later.

Figure 5:
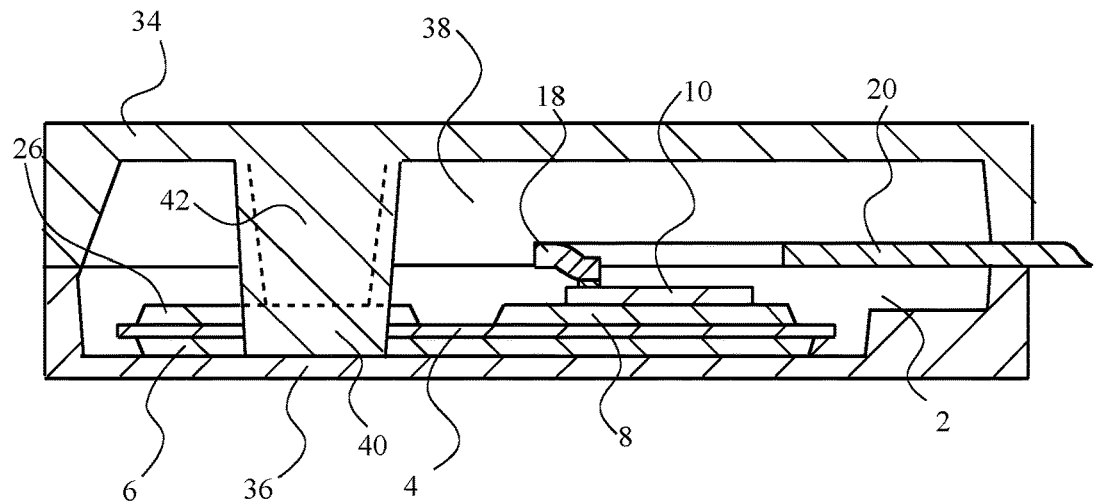
FIG. 5 is a central vertical cross-sectional view of a state in which an insulating substrate, a semiconductor circuit base, and a reinforcement and balance base of the semiconductor device of FIG. 1 are arranged in a mold in order to make a sealing body of the semiconductor device.
Figure 6:
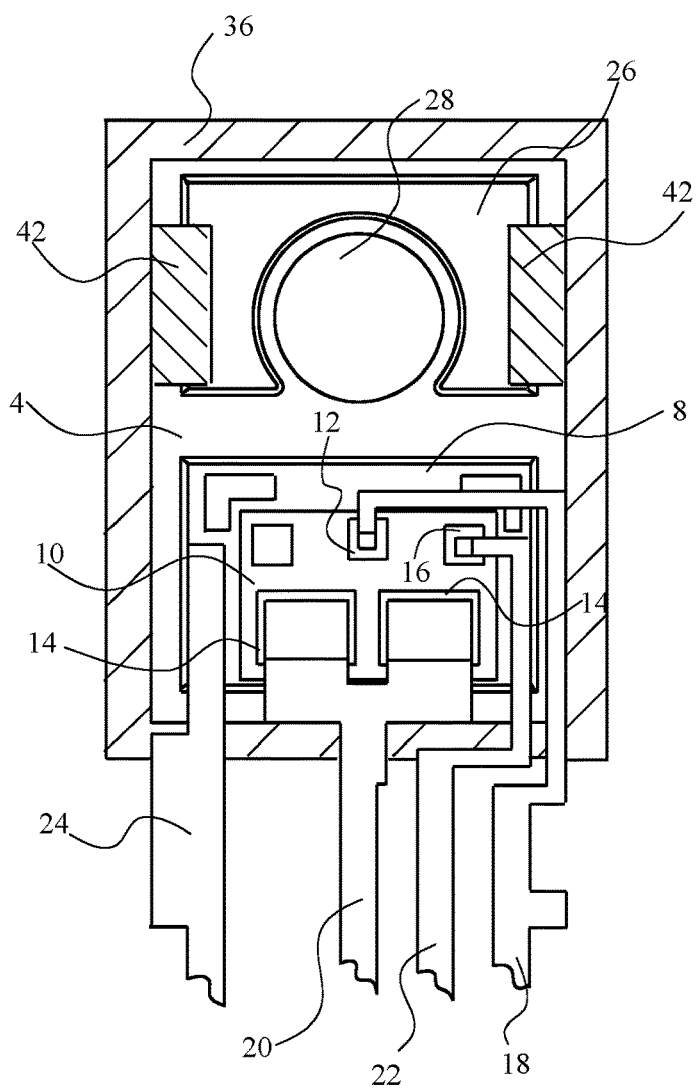
FIG. 6 is a cross-sectional view of a state in which the insulating substrate, the semiconductor circuit base, and the reinforcement and balance base of the semiconductor device of FIG. 1 are arranged in the mold in order to make the sealing body of the semiconductor device.

The sealing body 2 is made for example, as follows. As shown in FIG. 1, the drain region in the semiconductor chip 10 is connected to the semiconductor circuit film 8 on the insulating substrate 4 in which the heat radiating film 6 is formed on one surface and the semiconductor circuit film 8 and the reinforcement and balance film 26 are formed on the other surface. As shown in FIG. 4, the leads 18, 20 and 22 are connected to the pads 12, 14, 14 and 16 on the semiconductor chip 10, the lead 24 is connected to the semiconductor circuit film 8. They are located in a cavity 38 formed by an upper die 34 and a lower die 36 for transfer mold so that the leads 18, 20, 22, and 24 are held by the mating surfaces of the upper die 34 and lower die 38. The cavity 38 has an internal shape complementary to the outer shape of the resin sealing body 2. For example, the upper mold 34 has a protrusion 40 in the cavity 38 for preventing the resin from entering the portions corresponding to the insertion holes 28, 30 and 32. As shown in FIG. 6, the pressing protrusions 42 and 42 are formed in, for example, the upper mold 34 so as to be located on both sides of the protrusion 40 in the cavity 38 (shown by a dotted line in FIG. 5). The tips of the pressing protrusions 42 and 42 are in contact with at least the insulating substrate 4.

As shown in FIG. 6, the leads 18, 20, 22, and 24 are restrained by being sandwiched by the mating surfaces of the upper mold 34 and the lower mold 36. If the insulating substrate 4 is not restrained by the pressing protrusions 42 and 42, the insulating substrate 4 moves or warps when the resin is injected into the cavity 38. In order to prevent this, the pressing protrusions 42 and 42 are provided on areas at positions opposite to the leads 18, 20, 22, and 24 on the insulating substrate 4 As shown in FIG. 6, parts of these protrusions 42 and 42 are also in contact with the reinforcement and balance film 26 of the insulating substrate 4 in order to secure a sufficient contact area. When the resin is injected into the cavity 38, the resin does not adhere to the portions where the pressing protrusions 42 and 42 are present. When the sealing body 2 is taken out from the mold after the injection of the resin into the cavity 38 is completed, resin non-adhesive portions 44, 44 are formed on both sides of the insertion hole 30 as shown in FIGS. 2 and 3.

In the resin non-adhesive portions 44 and 44, parts of the reinforcement and balance film 26 are exposed as shown in FIG. 3. If the semiconductor circuit film 8 and the reinforcement and balance film 26 are integrally formed, a drain current flows not only in the semiconductor circuit film 8 but also in the reinforcement and balance film 26. Areas of the reinforcement and balance film 26 through which the drain current is flowing are exposed in the resin non-adhesive portions 44 and 44. To prevent electric shock to workers of a semiconductor device in which the semiconductor circuit film 8 and the reinforcement and balance film 26 are integrally formed, it is necessary to apply the resin to the resin non-adhesive portions 44 and 44 so that the resin non-adhesive portions 44 and 44 are filled in. However, in this semiconductor device, since the reinforcement and balance film 26 and the semiconductor circuit film 8 are insulated, no current flows through the reinforcement and balance film 26. Since there is no risk of electric shock even if a work touches the semiconductor device by hand, it is not necessary to fill the resin non-adhesive portions 44 and 44 with resin, and the manufacturing process can be simplified.

It is considered that the reinforcement and balance film 26 and a portion in the heat dissipation film 6 corresponding to the reinforcement and balance film 26 are not formed in the semiconductor device. But in the absence of these, the strength of the resin sealing body 2 corresponding to these portions of the completed semiconductor device will decrease. It is also considered to remove the reinforcement and balance film 26 by etching. But from the viewpoint of the weight, the amount of heat radiated, and the amount of warpage in the insulating substrate 4, the balance between the surface of the insulating substrate 4 on which the heat radiating film 6 is provided and the surface on which the semiconductor circuit film 8 is provided is lost. On the surface of the insulating substrate 4 on which the semiconductor circuit film 8 is provided, the weight balance between the portion where the lead terminals 18, 20, 22, and 24 are provided and the opposite portion thereof is lost. Therefore, there is a possibility that the warp of the entire semiconductor device will be large.

On the other hand, in this semiconductor device, the DCB substrate which is the base of the insulating substrate 4, the reinforcement and balance film 26, and the semiconductor circuit film 8 is etched so that the reinforcement and balance film 26 and the semiconductor circuit film 8 can be insulated. Therefore the areas of the metal part on both faces of the insulating substrate 4 are balanced, and, the metal portion areas of the surface in the insulating substrate 4 on which the semiconductor reinforcement and balance film 8 and the reinforcement and balance film 26 are provided can be balanced. As a result, it is possible to prevent the warp of the semiconductor device from becoming large.

In the described embodiment, the present invention has been embodied in a MOSFET, but the present invention is not limited to be embodied in a MOSFET, and can be embodied in any semiconductor device in which a current flows through a semiconductor circuit base. In the described embodiment, the insulating substrate 4, the heat dissipation film 6, the semiconductor circuit film 8, and the reinforcement and balance film 26 are formed from the DCB substrate, but these can be formed from a normal printed circuit board instead of the DCB substrate.

The invention claimed is:

1. A semiconductor device comprising:
    an insulating substrate;
    a semiconductor circuit base provided on one surface of the insulating substrate;
    a semiconductor chip provided on the semiconductor circuit base;
    a metal reinforcement and balance base spaced to the semiconductor circuit base on the one surface of the insulating substrate; and
    a resin-molded enclosure into which the insulating substrate, the semiconductor circuit base, the semiconductor chip, and the metal reinforcement and balance base are sealed, and having a resin non-adhesive portion,
    wherein the resin non-adhesive portion is provided so that a portion of the insulating substrate is exposed from the resin-molded enclosure.

2. The semiconductor device according to claim 1, wherein the resin non-adhesive portion is provided at a position so that a portion of the metal reinforcement and balance base is also exposed from the resin-molded enclosure.

3. The semiconductor device according to claim 1, wherein the metal reinforcement and balance base is provided on the insulating substrate opposite to a direction in which a lead connected to the semiconductor chip protrudes from the resin-molded enclosure.

4. The semiconductor device according to claim 1, wherein:
    the insulating substrate and the semiconductor circuit base have rectangular shapes,
    the reinforcement and balance base is formed on the insulating substrate opposite to a direction in which a lead connected to the semiconductor chip protrudes from the enclosure and has two ends on both sides of the insulating substrate parallel to the direction, and
    two resin non-adhesive portions are provided, and in the two resin non-adhesive portions the two ends of the metal reinforcement and balance base and portions of the insulating substrate near the two ends of the metal reinforcement and balance base are exposed from the resin-molded enclosure.

\* \* \* \* \*